United States Patent
Eisaman et al.

(10) Patent No.: US 12,365,592 B2
(45) Date of Patent: Jul. 22, 2025

(54) METHOD FOR TRANSFERRING GRAPHENE FROM METAL SUBSTRATES

(71) Applicant: The Research Foundation for The State University of New York, Albany, NY (US)

(72) Inventors: Matthew Eisaman, Port Jefferson, NY (US); Jan Folkson, Williston Park, NY (US); Joseph Andrade, Stony Brook, NY (US)

(73) Assignee: The Research Foundation for The State University of New York, Albany, NY (US)

( * ) Notice: Subject to any disclaimer, the term of this patent is extended or adjusted under 35 U.S.C. 154(b) by 0 days.

(21) Appl. No.: 17/298,073

(22) PCT Filed: Nov. 29, 2019

(86) PCT No.: PCT/US2019/063867
§ 371 (c)(1),
(2) Date: May 28, 2021

(87) PCT Pub. No.: WO2020/113174
PCT Pub. Date: Jun. 4, 2020

(65) Prior Publication Data
US 2022/0119262 A1    Apr. 21, 2022

Related U.S. Application Data

(60) Provisional application No. 62/773,681, filed on Nov. 30, 2018.

(51) Int. Cl.
*C23C 16/00*   (2006.01)
*C01B 32/184*   (2017.01)
(Continued)

(52) U.S. Cl.
CPC .......... *C01B 32/194* (2017.08); *C01B 32/184* (2017.08); *C23C 16/01* (2013.01);
(Continued)

(58) Field of Classification Search
CPC ...................................................... C23C 16/00
See application file for complete search history.

(56) References Cited

U.S. PATENT DOCUMENTS 9,216,559 B2   12/2015   Ren et al.
9,418,839 B2   8/2016    Zaretski et al.
(Continued)

FOREIGN PATENT DOCUMENTS

CN   103311502 A   9/2013
CN   102583352 B   12/2013
(Continued)

OTHER PUBLICATIONS

"Direct transfer of graphene onto flexible substrates", Luiz G. P. Martins, Yi Song, Tingying Zeng, Mildred S. Dresselhaus, Jing Kong, and Paulo T. Araujo, 17762-17767, PNAS, Oct. 29, 2013, vol. 110 No. 44. (Year: 2013).*
(Continued)

*Primary Examiner* — Gordon Baldwin
*Assistant Examiner* — Mohammad Mayy
(74) *Attorney, Agent, or Firm* — Fox Rothschild LLP

(57) ABSTRACT

Provided are methods for transferring graphene from graphene-on-metal foil onto a substrate. The method does not require chemical etching to remove the metal foil and provides more a uniform graphene with improved electronic properties. The present invention also provides compositions comprising graphene, a binder, and a substrate.

25 Claims, 14 Drawing Sheets

(51) Int. Cl.
*C01B 32/194* (2017.01)
*C23C 16/01* (2006.01)
*C23C 16/26* (2006.01)
*C23C 16/46* (2006.01)
*C23C 16/56* (2006.01)

(52) U.S. Cl.
CPC ............ *C23C 16/26* (2013.01); *C23C 16/463* (2013.01); *C23C 16/56* (2013.01)

(56) References Cited

U.S. PATENT DOCUMENTS

| | | | |
|---|---|---|---|
| 10,600,582 | B1 | 3/2020 | Brambilla et al. |
| 11,165,066 | B2 | 11/2021 | Ikenuma |
| 2006/0191621 | A1 | 8/2006 | Kummer et al. |
| 2014/0130972 | A1 | 5/2014 | Ren et al. |
| 2015/0240038 | A1* | 8/2015 | Macedo Fechine .. B32B 37/153 156/247 |
| 2016/0137507 | A1 | 5/2016 | You et al. |
| 2016/0318207 | A1 | 11/2016 | Zaretski et al. |
| 2017/0021344 | A1 | 1/2017 | Hau |
| 2017/0217777 | A1 | 8/2017 | Hong et al. |
| 2018/0090709 | A1* | 3/2018 | Meng .................. H01L 51/0096 |
| 2018/0219302 | A1* | 8/2018 | Vella .................... H01Q 21/065 |
| 2018/0257359 | A1 | 9/2018 | Johnson et al. |
| 2019/0256357 | A1 | 8/2019 | Choi et al. |

FOREIGN PATENT DOCUMENTS

| | | | | |
|---|---|---|---|---|
| CN | 203367417 | U | | 12/2013 |
| CN | 103779084 | A | | 5/2014 |
| CN | 104016335 | A | * | 9/2014 |
| CN | 104485385 | A | | 4/2015 |
| CN | 104528694 | B | | 7/2016 |
| CN | 104393239 | B | | 2/2017 |
| CN | 106672956 | A | | 5/2017 |
| CN | 105958079 | B | | 4/2018 |
| CN | 106025289 | B | | 11/2018 |
| CN | 105789155 | B | | 2/2019 |
| CN | 105390738 | B | | 4/2019 |
| CN | 106458602 | B | | 5/2019 |
| CN | 106374111 | B | | 9/2019 |
| CN | 110234602 | A | | 9/2019 |
| CN | 106191805 | B | | 12/2020 |
| CN | 106191804 | B | | 4/2021 |
| KR | 20160049915 | A | | 5/2016 |
| KR | 20160089529 | A | | 7/2016 |
| KR | 20190040261 | A | | 4/2019 |
| TW | 1608995 | B | | 12/2017 |
| WO | WO-2016126208 | A1 | * | 8/2016 ........... B32B 27/304 |
| WO | 2017065530 | A1 | | 4/2017 |
| WO | 2018031064 | A1 | | 2/2018 |
| WO | WO 2018/133053 | | * | 7/2018 |
| WO | WO-2018133053 | A1 | * | 7/2018 ........... C01B 32/182 |
| WO | 2019099826 | A1 | | 5/2019 |
| WO | 2020113171 | A1 | | 6/2020 |
| WO | 2020113176 | A1 | | 6/2020 |

OTHER PUBLICATIONS

"Roll to roll encapsulation of metal nanowires between graphene and plastic substrate for high-performance flexible transparent electrodes" Bing Deng, Hailin Peng, Nano Lett. 2015, 15, 4206-4213. (Year: 2015).*
"Graphene synthesis by chemical vapor deposition and transfer by a roll-to-roll process", Zhen-Yu Juang, Chih-Yu Wu, Ang-Yu Lu, Ching-Yuan Su, Keh-Chyang Leou, Fu-Rong Chen, Chuen-Horng Tsai, CARBON 48, 3169-3174, (Year: 2010).*
CN104016335 A, English Translate, (Year: 2014).*
Oh, J. et al., "Laser-Assisted Simultaneous Pattering and Transferring of Graphene", J. of Phy Chem. (2013), vol. 117, pp. 663-668.
Fechine, G. et al., "Direct Dry Transfer of Chemical Vapor Deposition Graphene to Polymeric Substrates", Carbon (2015), vol. 83, pp. 224-231.
Lin, Y. et al., "Clean Transfer of Graphene for Isolation and Suspension", ACS NANO (2011), vol. 5:3, pp. 2362-2368.
Uwanno, T. et al., "Fully Dry PMMA Transfer of Graphen on h-BN using a Heating Cooling System", 2D Materials (2015), vol. 2, 8 pgs.
Choi, M. et al., "Thermally Controlled, Patterned Graphene Transfer Printing for Transparent and Wearable Electronic/Optoelectronic System", Adv. Funct. Mater. (2015), vol. 25, pp. 7109-7118.

* cited by examiner

2A

2B

METHOD FOR TRANSFERRING GRAPHENE FROM METAL SUBSTRATES

FIELD OF THE INVENTION

The present invention relates to a method for transferring graphene-on-metal foil onto a substrate. The present invention also relates to compositions comprising graphene-on-metal foil and a substrate.

BACKGROUND

Graphene thin films that are both optically transparent and electrically conductive are an important component in many devices, including transparent electrodes and conductive layers in displays, touch screens, windows, and solar cells; and an emerging suite of biomedical applications such as smart contact lenses. It is a challenge to engineer thin films that are highly transparent to visible light, while simultaneously having little resistance to the flow of electrical current. In addition to improved electro-optical performance, graphene films have desirable properties not possible with today's materials, including flexibility, low cost, negligible optical scattering, extreme strength, and impermeability to water vapor. In addition, a manufacturing process in any of the above-mentioned applications requires controlled, uniform graphene growth and precise graphene placement on top of various material surfaces, along with the development of cost-effective techniques for device fabrication.

For device fabrication, graphene is generally transferred onto semiconductor, glass, or plastic substrates. The growth of graphene via chemical vapor deposition (CVD) onto metal foils, such as copper and nickel, results in graphene of high quality. However, a commonly used method of transferring graphene onto the ultimate target substrate involves spin coating and curing PMMA onto the non-copper (graphene) side, then etching the copper by floating in a copper etchant such as ammonium persulfate (APS) or ferric chloride. The etchant residue can cause undesired contamination of the graphene, and also requires that the target substrate be compatible with the etchant. In addition, etching away the metal precludes reuse of the metal for subsequent graphene growth. There exists a need for methods for transfer of graphene and removal of copper that do not rely on chemical etchants.

SUMMARY OF THE INVENTION

It is an object of the present invention to provide a method for transferring graphene-on-metal foil onto a substrate by a method that does not require the use of chemical etchants. It is a further object of the present invention to provide a method for removing the metal foil from CVD grown graphene that avoids the use of chemical etching.

The invention describes a method for transferring graphene-on-metal foil onto a substrate including (i) coating either the graphene side of graphene-on-metal foil with a binding solution or coating a substrate with a binding solution, or both, the binding solution including a solvent and a solute; (ii) contacting the binding-solution side(s) of the binding-solution-on-graphene-on-metal foil with the substrate or coated substrate; (iii) heating; (iv) cooling; and (v) removing the metal foil.

The invention further describes a composition comprising graphene, a binder and a substrate.

BRIEF DESCRIPTION OF THE FIGURES

FIG. 12 shows that the surface of the sample has low defect density.

DETAILED DESCRIPTION OF THE INVENTION

Figure 1:
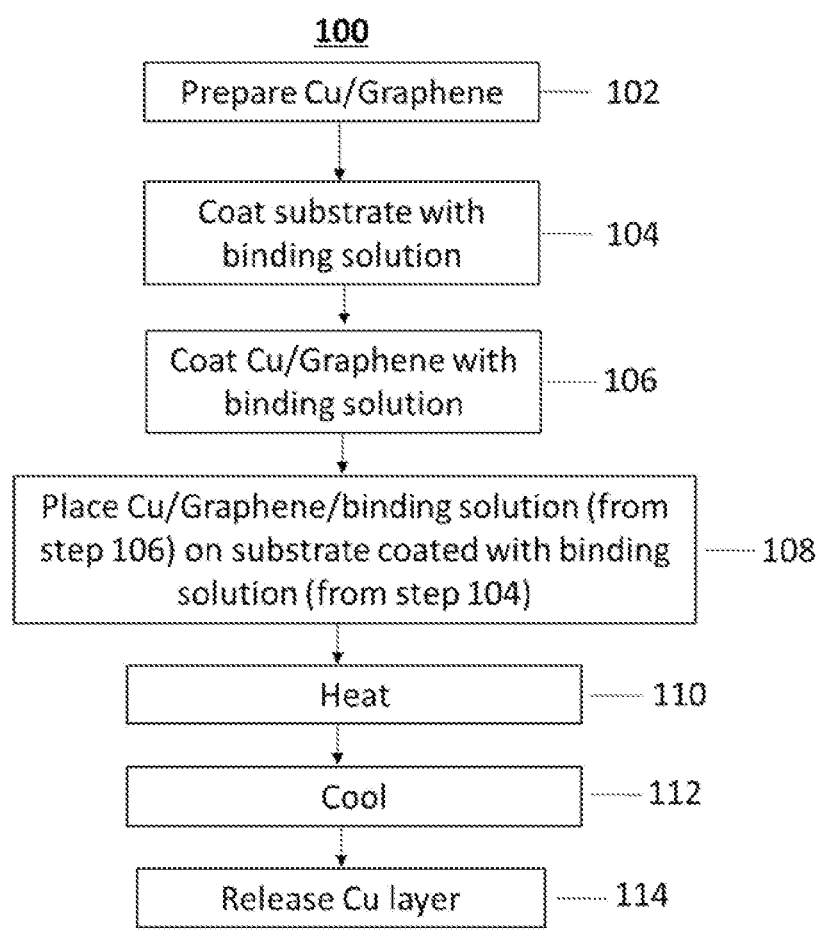
FIG. 1 is a flow chart illustrating a method for transferring graphene-on metal foil onto a substrate.
Figure 2:
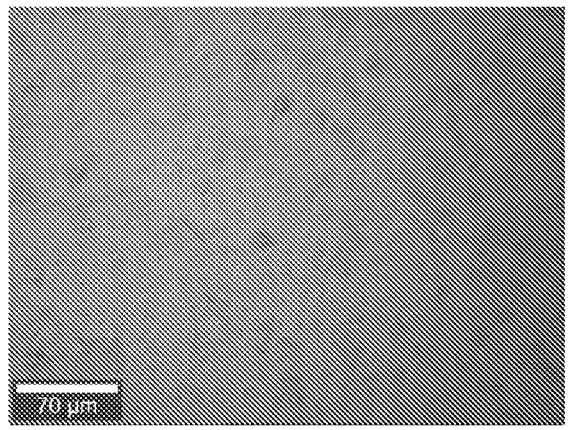
FIG. 2A is a microscope image of a PMMA/Gr surface on an acrylic substrate.
FIG. 2B is a Raman spectrum of a PMMA/Gr surface. Large PMMA peaks indicate the presence of a PMMA layer and an acrylic substrate, while peaks at 2690 $cm^{-1}$ (2D peak) and 1580 $cm^{-1}$ (G peak) indicate the presence of graphene.
Figure 2:
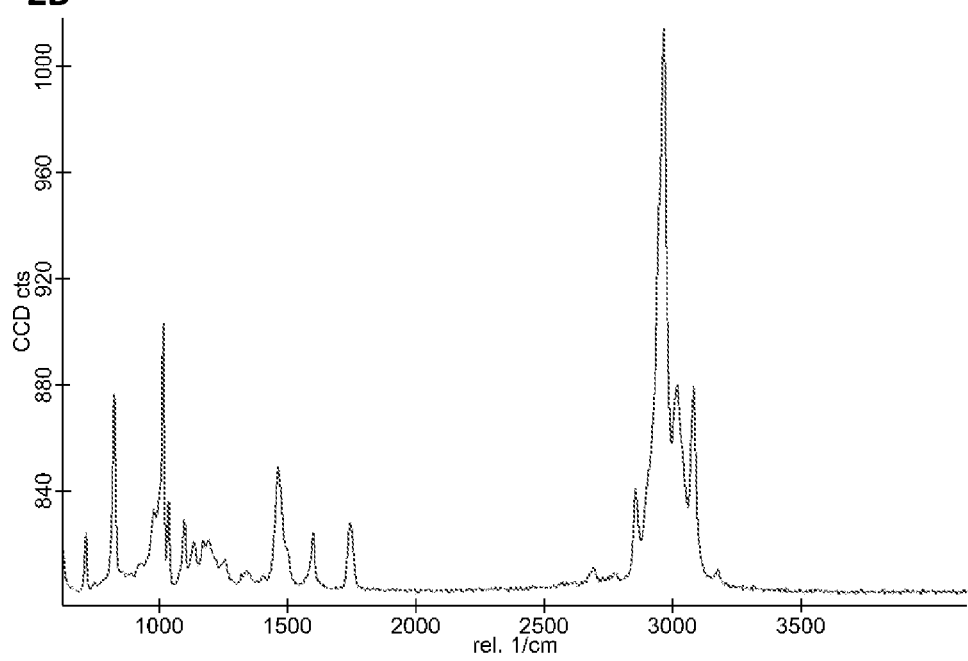
Figure 3:
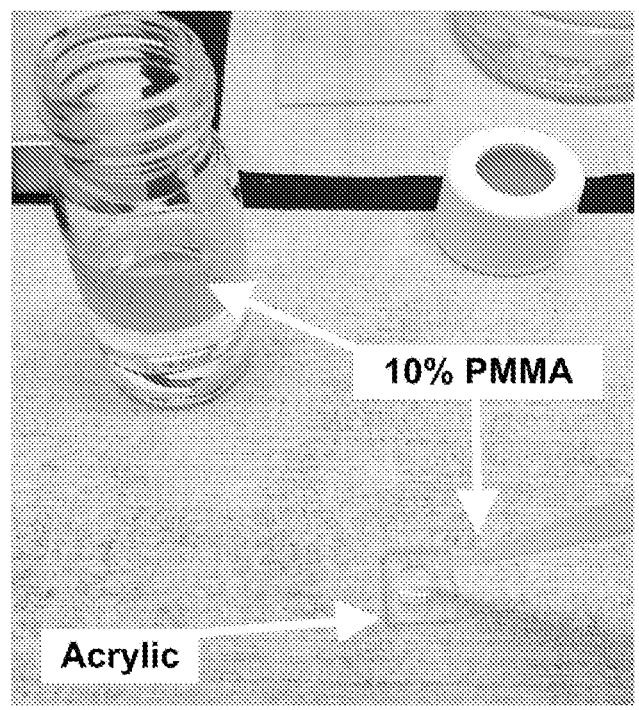
FIG. 3 is a photograph showing the placement of 10 μL of 10% PMMA solution onto an acrylic substrate.
Figure 4:
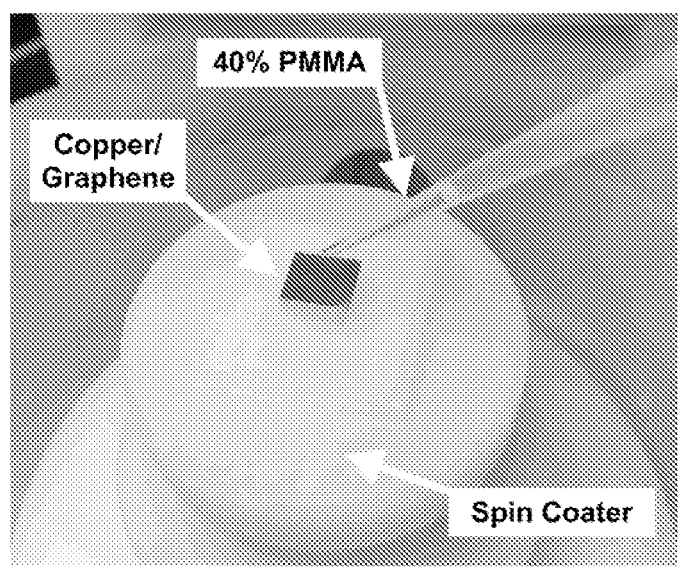
FIG. 4 is a photograph showing spin-coating of 30 μL of 40% PMMA solution onto Cu/CVD Gr foil (Gr side up) at 3000 rpm for 60 s.
Figure 5:
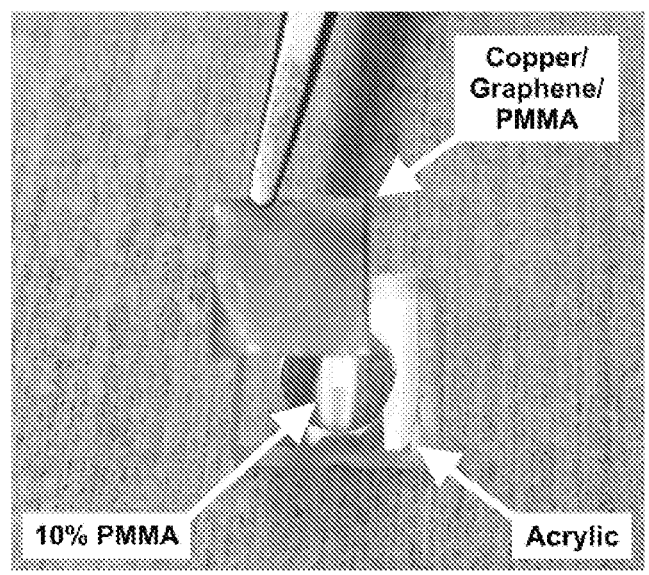
FIG. 5 is a photograph showing placement of Cu/Gr/PMMA sample (Cu-side up) onto 10% PMMA solution on acrylic.
Figure 6:
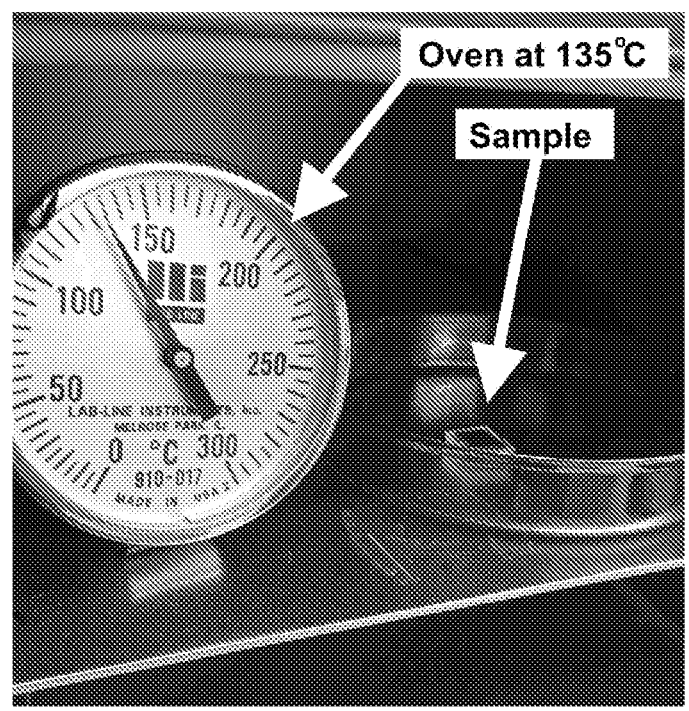
FIG. 6 is a photograph showing heating of a sample in an oven at 135° C. for 2 h.
Figure 7:
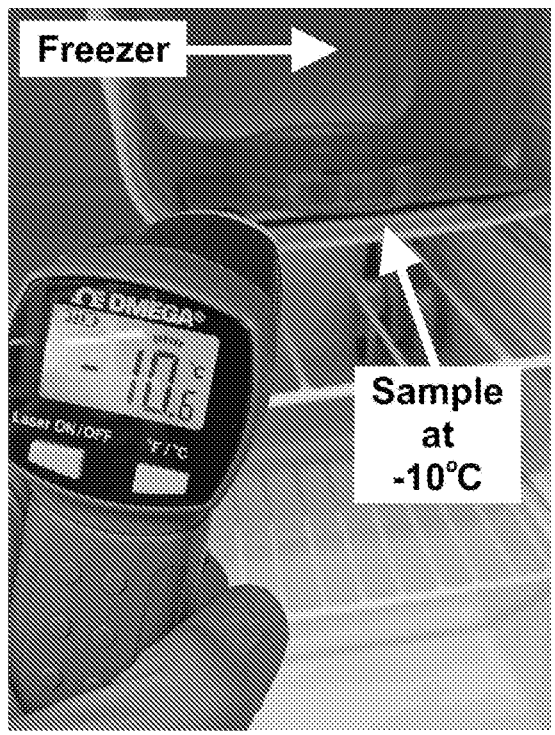
FIG. 7 is a photograph showing rapid cooling of a sample in a freezer at −10° C. for 30 minutes immediately following removal from oven.
Figure 8:
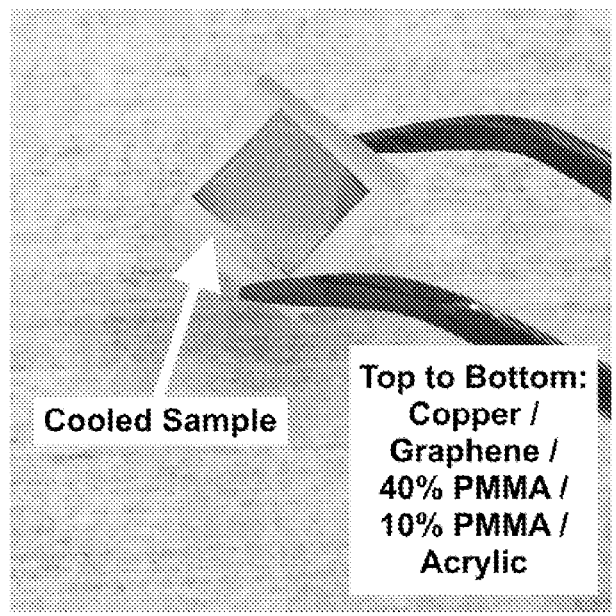
FIG. 8 is a photograph showing a cooled sample after removal from a freezer. The PMMA layers are fused together and the Cu layer detaches from Gr/PMMA.
Figure 9:
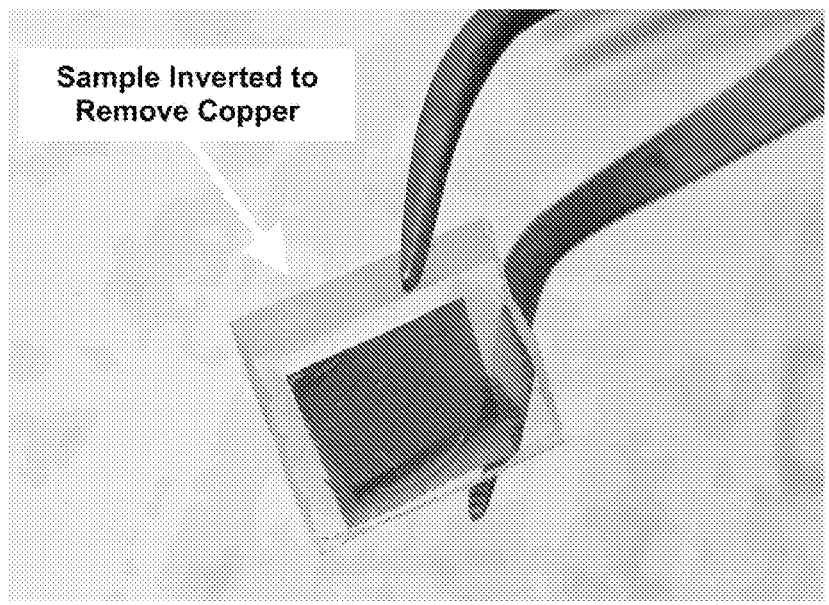
FIG. 9 is a photograph showing a sample inverted to remove Cu foil from remaining substrate. No force is required for removal.
Figure 10:
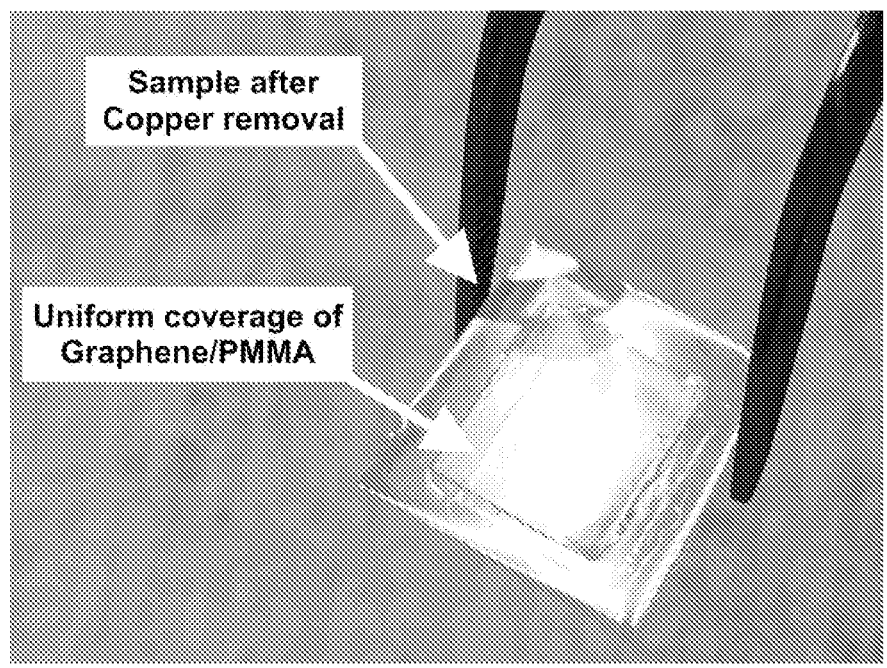
FIG. 10 is a photo showing that after Cu removal, a complete and uniform layer of PMMA/Gr remains on the acrylic.
Figure 11:
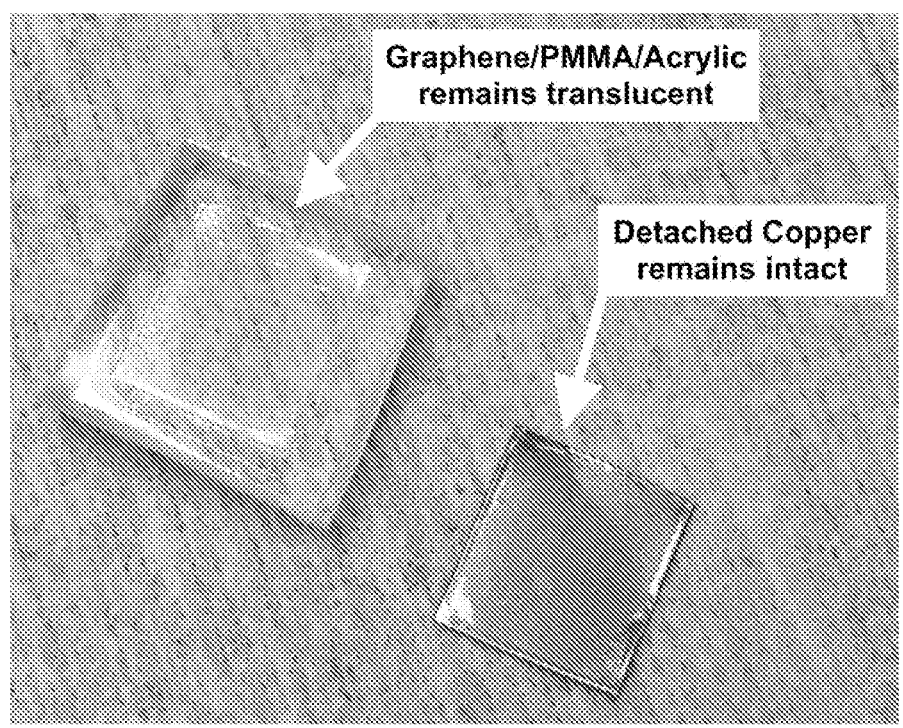
FIG. 11 is a photo showing that the PMMA/Gr layer remains translucent on acrylic, and the removed Cu foil remains intact.

The present invention provides a low-cost, high-quality transfer of CVD-grown graphene from a metal foil growth substrate onto the target substrate of choice through the use of a binder solution, combined with a heating and cooling cycle. The described method allows for uniform contact between the graphene and substrate, even in the presence of inevitable surface roughness on both the Cu-foil/graphene sample and the substrate. This conformal contact results from the presence of the binding solution at the substrate-graphene interface. The binder contains a solvent that dissolves a surface layer on the substrate, ensuring conformal contact to the graphene. This contact, in turn, results in clean separation of the graphene from the Cu-foil after the cooling step. In contrast, standard methods require peeling of graphene from the Cu foil or the use of chemical etchants to dissolve the Cu foil, both of which result in poorer quality graphene. The method described herein produces graphene that is readily removed from the Cu foil, and even simply falls off following the cooling step. This results in more uniform graphene with improved electronic properties.

Advantageously, the subject method does not require Cu etching at any step of the process, allowing the Cu-foil to be reused for subsequent graphene growth cycles via CVD, drastically reducing cost. The method of the invention circumvents the two main disadvantages of other graphene transfer process, namely: (1) The copper cannot be recycled for subsequent graphene growth cycles or general reuse because it is etched away, thereby significantly increasing the cost; and (2) When the target substrate is a polymer, the polymer support layer may not be easily removed since both the substrate and polymer support are both susceptible to dissolution by a similar set of solvents. The method disclosed herein provides an etchant-free transfer of graphene from copper, or other metal growth catalyst, to a wide array of polymer substrates that does not require application of a substantial continuous force such as peeling.

The methods disclosed herein may also be used to transfer from the catalytic metal substrate (such as Cu) to a first substrate (such as PMMA) without etching, followed by transferring the graphene from the first substrate to a target substrate of any composition by using, for example, solvents and heat to selectively remove the PMMA after transfer to the target substrate. In this embodiment, the advantage of catalytic metal substrate reuse is retained, but there may be PMMA residue on the graphene as is true of all sacrificial-PMMA-based transfer methods.

The term "graphene" as used herein refers to a polycyclic aromatic molecule formed from a plurality of carbon atoms covalently bound to each other. The covalently bound carbon atoms may form a 6-membered ring as a repeating unit, or may further include at least one of a 5-membered ring and a 7-membered ring. Accordingly, in the graphene, the covalently bound carbon atoms (generally having sp2 hybridization) form a single layer. The graphene may have various structures which are determined according to the amount of the 5-membered rings and/or 7-membered rings which may be contained in the graphene. The term "graphene" used herein may refer to a single layer (single-layer graphene) or a plurality of layers (often referred to as either multi-layer graphene or few-layer graphite). The graphene may comprise 1-50 planar graphene sheets, for example as a growth of multi-layer graphene. Graphene layers in multi-layer graphene each occupy about 340 pm, and so multi-layer graphene (1-50 layers) may have a thickness of about 0.3 nm to about 170 nm, or in other aspects from about 1 nm to about 30 nm. These layer spacings increase by about 10% (from 340 pm to 370 pm per layer) for $LiC_6$ relative to unintercalated multi-layer graphene.

As used herein, the term "doping" refers to a process of preparing carriers by providing electrons to or removing electrons from a part of a conjugated bonding it-orbit to provide conductivity to a conjugated compound, e.g., a polycyclic aromatic carbon compound. Here, the process of adding new electrons or removing electrons is referred to as "doping".

The term "dopant" as used herein refers an organic dopant, an inorganic dopant, or a combination including at least one of the foregoing.

In step 102, graphene is prepared by chemical vapor deposition (CVD). In this process, graphene is formed on a catalytic metal substrate through the decomposition of hydrocarbon precursors such as methane, commonly mixed with hydrogen, at suitable temperatures (~1000 C-1100 C) and pressures (~1 mTorr-10 Torr). (G. Deokar et al., Towards high quality CVD graphene growth and transfer, Carbon, 89, 82-92 (2015); N. C. Bartelt and K. F. McCarty, *Graphene growth on metal surfaces*, MRS Bulletin, 37, 1158-1165 (2012)). Suitable metal substrates may be copper, nickel, platinum, or iridium. To achieve uniform single-layer graphene sheets, most often a copper substrate is used. For multi-layer graphene, either copper or, more commonly, nickel is selected. These specific metals are chosen as they both act as a catalyst for graphene growth and due to the similar lattice spacing to that of graphene, provide minimal lattice mismatch between the materials.

In another aspect, the graphene layer may comprise one or more dopants prior to contact with the substrate or coating. For example, an alkali metal dopant may optionally be intercalated into the graphene prior to its treatment with a binding solution. The alkali metal dopant may be Na, Cs, Li, K, and Rb, with Li, Na and K being preferred. The graphene may be doped with the alkali metal dopant by, for example, contacting the graphene with a suitable electrolyte solution. The counterion to the alkali metal may be any anion that is unreactive and stable under the conditions of the graphene structure fabrication and use. Preferred counterions include $ClO_4^-$ and $PF_6^-$. The electrolyte solution further comprises a solvent for the alkali metal salt. Preferred solvents include ethylene carbonate (EC), diethyl carbonate (DEC), dimethyl carbonate (DMC), ethyl methyl carbonate (EMC), and mixtures thereof. The alkali metal salt may present in the electrolyte solution in a concentration from 0.5 to 2 M, or in a concentration sufficient to form $MC_{72}$, $MC_{36}$, $MC_{18}$, $MC_{12}$, and/or $MC_6$ (i.e., $LiC_{72}$, $LiC_{36}$, $LiC_{18}$, $LiC_{12}$, and/or $LiC_6$), and preferably $MC_6$. The electrolyte solution may further be in contact with a metal source, such as a metal foil, which maintains a high concentration of alkali metal in the electrolyte solution. In one embodiment, the multilayer graphene is contacted with 1-1.2 M $LiPF_6$ in 1:1 wt ratio of EC/DEC (Lithium hexafluorophosphate solution in ethylene carbonate and diethyl carbonate, while the electrolyte is contacted with Li metal foil. The alkali metal ions are intercalated into the multilayer graphene (for example, forming $LiC_{72}$, $LiC_{36}$, $LiC_{18}$, $LiC_{12}$, and/or $LiC_6$). In this case, the interlayers preferably do not include additional alkali metal ions. The intercalated graphene is then used in the methods and structures provided herein.

In the method of the invention, a binding solution is coated on the graphene side of graphene-on-metal foil (step 106), or a binding solution is coated on a substrate (step 104), or both the graphene side of graphene-on-metal foil and the substrate are coated with a binding solution (both step 104 and step 106).

In step 104, a substrate is coated with a binding solution. Preferred coating methods include spin coating, spraying, drop casting, blade coating or dip coating. The binding solution comprises a solute and a solvent. Representative solutes in the binding solution include polyamides, polyimides, polychloroethylenes, polyurethanes, polyvinylethers, polythioureas, polyacrylates, polycarbonates, polyesters, polyethylenes, polypropylenes, polysytrenes, PTFE, polyethylacetates, polyvinylacetates and fluoropolymers. Preferred solutes in the binding solution include poly(methyl methacrylate), polyvinyl butyral, ethylene-vinyl acetate, thermoplastic polyurethane, polyethylene terephthalate, thermoset ethylene-vinyl acetate, polycarbonate, and polyethylene. Suitable solvents in the binding solution include water, chlorobenzene, acetone, methanol, N-methyl-2-pyrrolidone, tetrahydrofuran, dimethyl formamide, hexane, toluene, isopropyl alcohol, acetonitrile, chloroform, acetic acid, 2-methoxyethanol, n-butylamine, and mixtures thereof.

Representative substrates include polyamides, polyimides, polychloroethylenes, polyurethanes, polyvinylethers, polythioureas, polyacrylates, polycarbonates, polyesters, polyethylenes, polypropylenes, polysytrenes, nylons, polyethylacetates, polyvinylacetates and fluoropolymers. More preferred substrates include poly(methylmethacrylate), polycarbonate, polyethylene, polypropylene, polyester, nylon, and polyvinyl chloride.

In an embodiment, the binding solution further comprises a dopant that increases the conductivity of the graphene. The dopant in the binding solution serves to increase the concentration of charge carriers in the adjacent graphene layer. In a further embodiment, the dopant may be an alkali-metal salt. The alkali metal of the salt may be selected from Li, Na and K. The alkali metal salt may be selected from the group consisting of $MClO_4$ or MI, wherein M is selected from the group consisting of Li, Na and K. The concentration of M is in the range of about 2% to about 45% by weight (w/w). In an embodiment, the dopant is $NaClO_4$. In a preferred embodiment, solute in the binding solution comprises between about 10 wt % and about 50 wt % poly(methylmethacrylate) and the solvent is selected from the group consisting of N-methyl-2-pyrrolidone, tetrahydrofuran or dimethylformamide.

In step 106, the graphene on metal foil is coated with a binding solution. In one aspect, the binding solution coating the substrate may be the same or different from the binding solution coating the graphene-on-metal foil. In an embodiment, the binding solution further comprises a dopant that increases the conductivity of the graphene as provided above. In a representative embodiment, 40% PMMA solution is spin-coated onto Cu/Gr foil at 3000 rpm for 60 seconds. In one embodiment, approximately 30 µL of a 40% PMMA solution is spin-coated onto a 1 cm×1 cm area of Cu/Gr foil at 3000 rpm for 60 seconds.

In step 108, the product of step 104 and the product of step 106 are joined together. In particular, the binding solution (ex. PMMA) side of the product of step 104 is joined together with the binding solution (ex. PMMA) side of the product of step 106.

In step 110, the product of step 108 is heated. In an embodiment, the heating step is performed at a temperature in the range of about 110° C. to about 160° C., and the temperature is held for a time ranging from about 5 minutes to about 4 hours.

In step 112, the product of step 110 is cooled. In an embodiment, the cooling step is performed at a temperature in the range of about −10° C. to about 20° C., and the temperature is held for a time ranging from about 5 minutes to about 4 hours.

In step 114, the copper foil is released. Advantageously, the heating step followed by a cooling step allows the metal growth substrate to easily release from the graphene. For example, the sample can be inverted to remove the metal foil from the graphene and minimal to no additional force is required for removal. In practice, there may be some adherence of the polymer to the catalytic metal substrate, for example at one or more edges of the structure or at a defect, where the polymer is in contact with the metal substrate, rather than separated by the graphene. However, in the absence of such polymer-metal substrate contact, substantially no force needed to separate the graphene from the metal substrate, and the graphene may be separated from the metal substrate by inverting the sample. After removal, the metal foil can be reused for subsequent graphene growth.

Although illustrative embodiments of the present invention have been described herein, it is to be understood that the invention is not limited to those precise embodiments, and that various other changes and modifications may be made by one skilled in the art without departing from the scope of the invention.

The described methods can be used to prepare compositions comprising graphene on metal foil and a substrate.

The compositions can be used to make electronic and/or optical devices that may be in the form of complete devices, parts or sub elements of devices, electronic components, etc. They can comprise a substrate onto at least one surface of which has been applied a layer of an electrically conductive coating comprising graphene. In an embodiment, the electronic device is a flexible electronic device or an electrically conductive window material.

Printed electronics may be prepared by applying the compositions to a substrate in a pattern comprising an electrically conductive pathway designed to achieve the desired electronic device. The pathway may be solid, mostly solid, in a liquid or gel form, etc.

Other applications include, but are not limited to: passive and active devices and components; electrical and electronic circuitry, integrated circuits; flexible printed circuit boards; transistors; field-effect transistors; microelectromechanical systems (MEMS) devices; microwave circuits; antennas; diffraction gratings; indicators; chipless tags (e.g. for theft deterrence from stores, libraries, etc.); security and theft deterrence devices for retail, library, and other settings; key pads; smart cards; sensors; liquid crystalline displays (LCDs); signage; lighting; flat panel displays; flexible displays, including light-emitting diode, organic light-emitting diode, and polymer light-emitting diode displays; backplanes and frontplanes for displays; electroluminescent and OLED lighting; photovoltaic devices, including backplanes; product identifying chips and devices; membrane switches; batteries, including thin film batteries; electrodes; indicators; printed circuits in portable electronic devices (for example, cellular telephones, computers, personal digital assistants, global positioning system devices, music players, games, calculators, etc.); electronic connections made through hinges or other movable/bendable junctions in electronic devices such as cellular telephones, portable computers, folding keyboards, etc.); wearable electronics; and circuits in vehicles, medical devices, diagnostic devices, instruments, etc.

The electronic devices may be radiofrequency identification (RFID) devices and/or components thereof and/or radiofrequency communication device. Examples include, but are not limited to, RFID tags, chips, and antennas. The RFID devices may be ultrahigh frequency RFID devices, which typically operate at frequencies in the range of about 868 to about 928 MHz. Examples of uses for RFIDs are for tracking shipping containers, products in stores, products in transit, and parts used in manufacturing processes; passports; barcode replacement applications; inventory control applications; pet identification; livestock control; contactless smart cards; automobile key fobs; etc.

The electronic devices may also be elastomeric (such as silicone) contact pads and keyboards. Such devices can be used in portable electronic devices, such as calculators, cellular telephones, GPS devices, keyboards, music players, games, etc. They may also be used in myriad other electronic applications, such as remote controls, touch screens, automotive buttons and switches, etc.

EXAMPLES

Example 1: Transfer of Graphene to an Acrylic Substrate

FIGS. 2-11 illustrate an example of the transfer of the graphene to an acrylic target substrate. Using acrylic as the target substrate (area~1 cm$^2$), 10 µL of liquid PMMA (10 wt %, 12,000 Dalton molecular weight) solution was placed onto the acrylic substrate (see FIG. 3). Additionally, 30 µL of 40% PMMA solution was deposited onto the graphene side of a 8 mm×8 mm CVD-grown graphene on copper foil and spun at 3000 rpm for 60 s (see FIG. 4). The Cu/Gr/PMMA was placed Cu side up onto the liquid PMMA/acrylic substrate described above (see FIG. 5) so that the PMMA side of the Gr contacts the PMMA side of the acrylic. The sample was then placed in an oven at 135° C. for 2 h (see FIG. 6). Upon removal from the oven, the sample was immediately placed into a freezer at −10° C. for 30 minutes (see FIG. 7). Upon removal from the freezer, the Cu foil was easily removed from the sample. Carefully turning the sample over caused the removal of the Cu foil without additional force (see FIGS. 8 & 9). After removal of the Cu foil, a translucent layer of the Gr/PMMA remained on the acrylic surface (see FIGS. 10 & 11). Raman spectroscopy of PMMA/graphene sample after transfer (see FIG. 2B) confirms that graphene has been transferred to the acrylic substrate.

Example 2

The 1 mm thick acrylic substrate (Sigma Aldrich, GF28405122) was cut into 12.5 mm×12.5 mm squares using a Boss Laser LS 1416 laser cutter, and then thoroughly cleaned using an isopropyl alcohol bath in ultrasound for 20 s and dried with $N_2$. Immediately afterward, they were placed into an argon filled glove box for storage until use. Single layer CVD graphene on copper purchased from Graphene Platform, was cut into 8 mm×8 mm squares and placed between two cleaned microscope slides to ensure flatness and then also placed into the same argon filled glove box. Using a micro-pipette, 15 µL of a 20% wt/V poly (methyl methacrylate)/n-methyl-2-pyrrolidone (PMMA/NMP) solution was deposited in the center of the substrate and the graphene was carefully placed on the polymer droplet. After repeating the process for several samples, they were placed on a 150° C. hot plate and covered with a large beaker, to simulate an oven. After 90 minutes, the samples were transferred into a sealed water-cooled Peltier freezer, also in the glove box, that was purpose-built for this procedure.

Using the above-mentioned Peltier freezer, the samples are lowered directly into the cooling chamber, covered, and left to cool for 15 minutes at a temperature of −1° C. Once complete, they are removed from the cooling chamber and allowed to come to ambient temperature (20° C.) inside the glovebox for 5 minutes. The copper foil catalyst can be dislodged by gently tapping the substrate or by prying up one corner to unstick the Cu corner from contact with the PMMA, thereby leaving the graphene adhered to the surface of the acrylic.

Figure 12A:
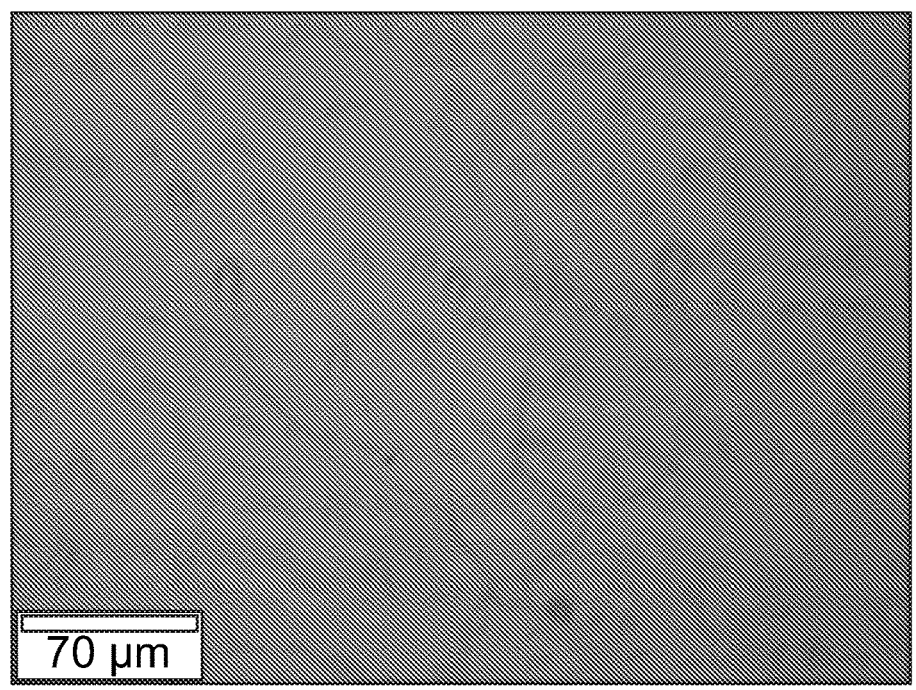
FIG. 12A shows an optical microscope image of the post-transfer sample surface.
Figure 12B:
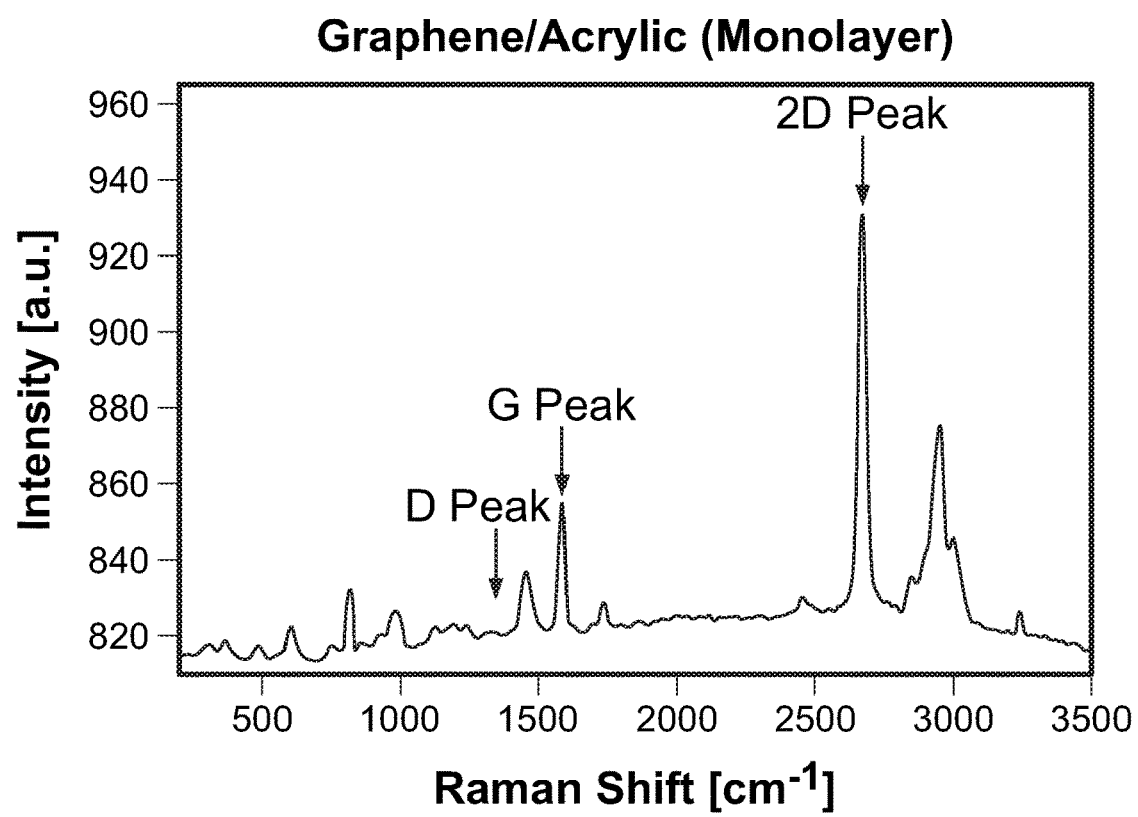
FIG. 12B shows the Raman spectrum of the sample. The existence of the D, G and 2D peaks at 1350 $cm^{-1}$, 1600 $cm^{-1}$ and 2700 $cm^{-1}$ respectively, indicate a successful transfer of graphene. The 'D' peak is very small indicating a very low defect density post-transfer. All other peaks correspond to the solid PMMA substrate.
Figure 13:
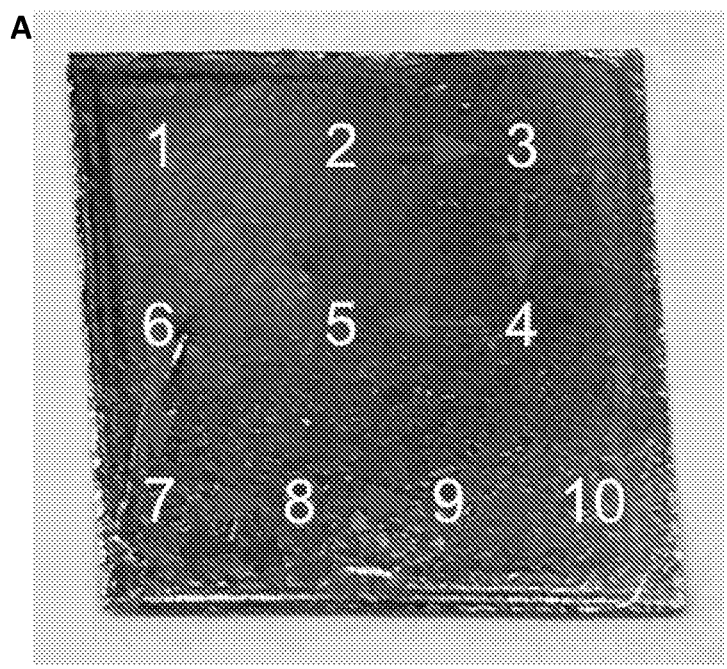
FIG. 13 shows the 10-point testing pattern on the graphene on the Cu sheet prior to transfer (A) and the graphene on the PMMA/acrylic after transfer (B) used in the procedure for obtaining the Raman data. To be certain of large-area coverage of graphene onto the acrylic substrate, the above pattern was employed and the results were averaged.
Figure 13:
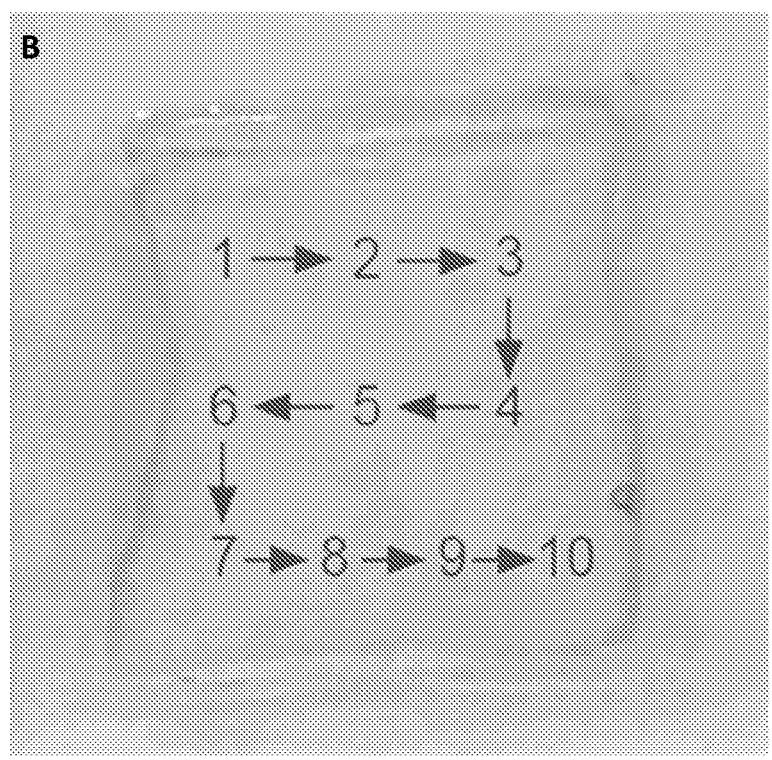
Figure 14A:
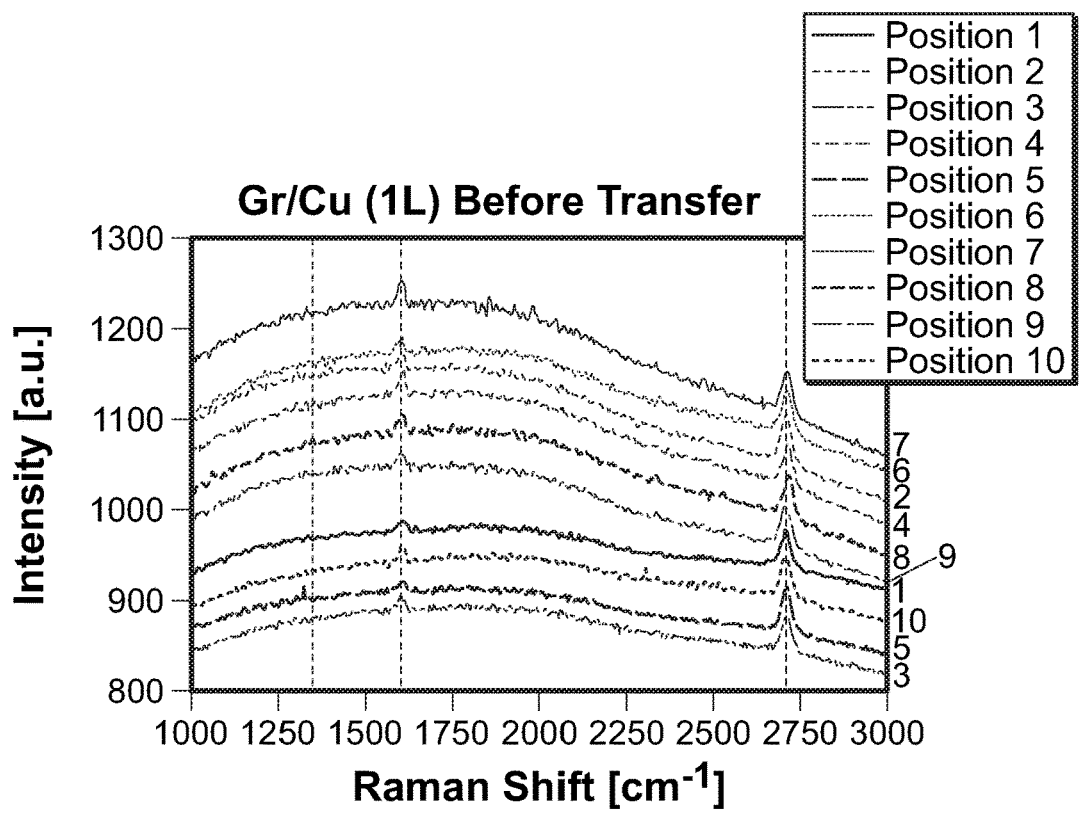
FIG. 14 shows the Raman spectra at the 10 testing points for the graphene on the Cu sheet prior to transfer (A) and the graphene on the PMMA/acrylic after transfer (B).
Figure 14B:
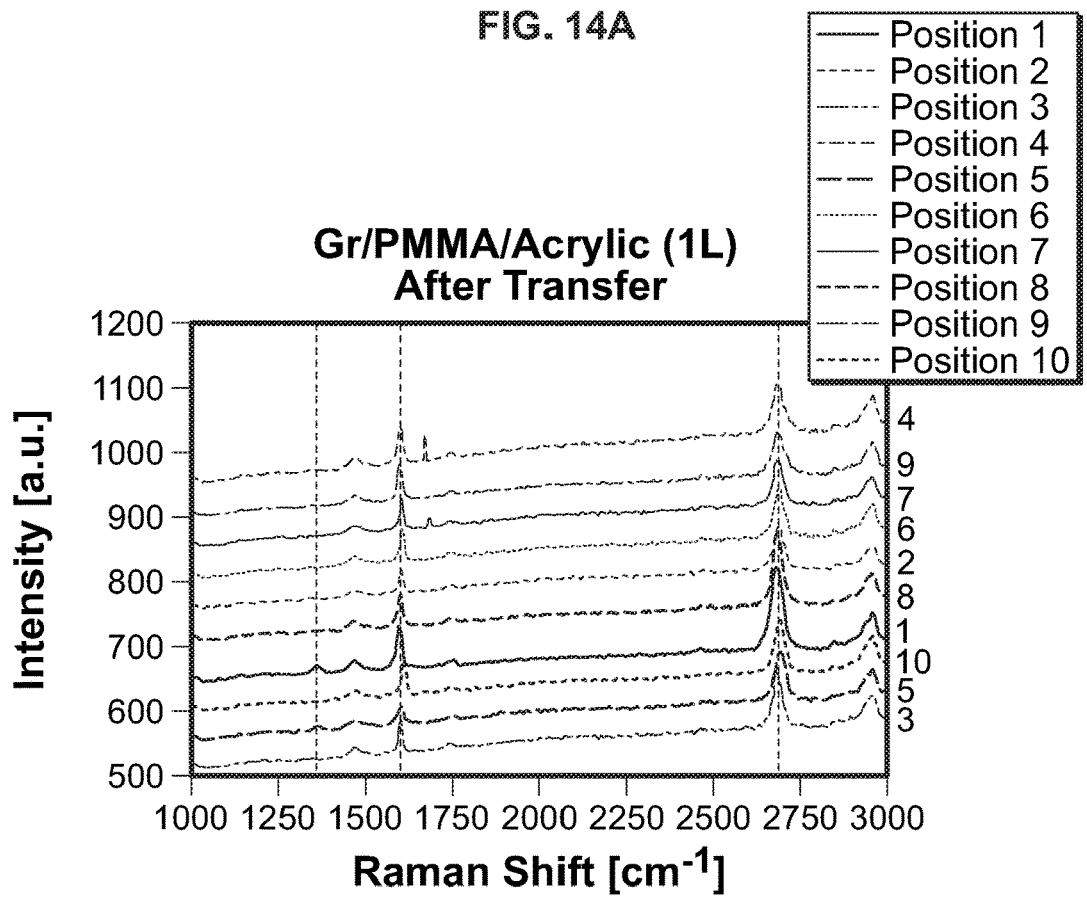

Ten points in a snaking "2" pattern along the surface of the sample were chosen (See FIG. 13) on the graphene on the Cu sheet prior to transfer (A) and the graphene on the PMMA/acrylic after transfer (B) were used in the procedure to obtain the Raman data (FIG. 14). To be certain of large-area coverage of graphene onto the acrylic substrate, the pattern shown in FIG. 13 was employed and the results were averaged. The shape of a number '2' was used to assure that the surface was sufficiently examined and aside from the shape, the points themselves were random. The above results demonstrated that graphene was indeed deposited using this method. Once confirmed, a deeper study was implemented whereby four additional samples were examined using similar methods. However, this time twenty spots (also in the shape of a '2') were measured and within each of the twenty spots there were five random points within a 100 µm×100 µm area, for a total of 125 points on each of the four samples. Graphene was determined to be present if the 2D and G peaks were detected, similar to the spectra in FIG. 12. Sample 1 showed a 69% graphene coverage, sample 2 showed an 84% graphene coverage, sample 3 showed a 62% graphene coverage and sample 4 showed a 76% graphene coverage. With a total of five hundred points measured across four samples, graphene was found on 72.75% of the surface on average.

Our experimental results point to a mechanism for the thermal release process. The relatively stronger graphene-polymer adhesion compared to graphene-copper adhesion, combined with thermal expansion coefficient mismatch leads to the separation of the copper foil in the thermal release method described herein. Specifically, 0.232 J/m$^2$ (Table 1) of thermal energy is required to raise the temperature of the system (graphene+copper+PMMA) to 150° C. from an ambient temperature 20° C. Graphene would typically contract at this increased temperature by 0.12% relative to ambient. However, because the copper substrate expands by 0.44% at 150° C. relative to ambient, the graphene is stretched 0.56%, resulting in 1.9 J/m$^2$ strain energy (Table 2). This means that the total energy put into the system is approximately 2.1 J/m$^2$. Previous experiments have suggested a range of copper-graphene adhesion energies from 0.7 J/m$^2$ to ~6 J/m$^2$. This wide range may be explained by variation in sample preparation, as oxidation can significantly influence the adhesion between graphene and the copper catalyst. Regardless, our experimental adhesion energy of 2.1 J/m$^2$, as calculated from the thermal release conditions, falls within this range, and is most likely sufficient to release graphene from its metal growth substrate.

TABLE 1

Estimate of the energy per unit area required to heat the Gr/Cu system to 150° C. from 20° C.

| | Density (kg m$^{-3}$) | m = Mass of Sample (kg) | c = Specific Heat (Jkg$^{-1}$ K$^{-1}$) | ΔT (K) | Q = mcΔT (J) | Qm$^{-2}$ = (Jm$^{-2}$) |
|---|---|---|---|---|---|---|
| Graphene (1) | 2.26E+03 | 4.96E−11 | 700 | 130 | 4.51E−06 | 7.05E−02 |
| Copper Surface (1) | 8.96E+03 | 2.06E−10 | 385 | 130 | 1.03E−05 | 1.61E−01 |
| Total Thermal Energy: | | | | | | 2.32E−01 |

TABLE 1-continued

Estimate of the energy per unit area required to heat the Gr/Cu system to 150° C. from 20° C.

| Copper | | Graphene | |
|---|---|---|---|
| Density (g/cm$^3$) | 8.96E+00 | Density (g/cm$^3$) | 2.26E+00 |
| Molar Mass (g/mol) | 6.35E+01 | Molar Mass (g/mol) | 1.20E+01 |
| Atomic Mass (g) | 1.06E−22 | Atomic Mass (g) | 1.99E−23 |
| Atoms per cm$^3$ | 8.49E+22 | Atoms per cm$^3$ | 1.13E+23 |
| Copper Lattice Constant (cm) | 3.60E−08 | Graphene Layer Thickness (cm) | 3.43E−08 |
| Atoms per cm$^2$ | 3.05E+15 | Atoms per cm$^2$ | 3.89E+15 |
| Mass of cm$^2$ (kg) | 3.22E−10 | Mass of cm$^2$ (kg) | 7.75E−11 |
| Mass of sample 8 mm × 8 mm (kg) | 2.06E−10 | Mass of sample 8 mm × 8 mm (kg) | 4.96E−11 |

The final rapid cooling step allows for quick removal of the copper foil from the desired substrate for further processing. Thus, the annealing temperature at 150° C. employed via this thermal release method is sufficient to remove the copper from the underlying substrate and once free from the copper foil, it is able to adhere to the liquid acrylic.

TABLE 2

| | Formula | Graphene | Copper |
|---|---|---|---|
| 2α = Areal Thermal Expansion Coefficient (K$^{-1}$) | | −9.35E−06 | 3.40E−05 |
| Ai = Area at 293 K (m$^2$) | | 6.40E−05 | 6.40E−05 |
| Ti = Initial Temperature (K) | | 2.93E+02 | 2.93E+02 |
| Tf = Final Temperature (K) | | 4.23E+02 | 4.23E+02 |
| ΔT = Temperature Change (K) | Tf − Ti | 1.30E+02 | 1.30E+02 |
| R = Fractional Areal Change due to Thermal Expansion at 423 K | 2αΔT | −1.22E−03 | 4.42E−03 |
| Af = Area at 423 K (m$^2$) | Ai + (Ai*R) | 6.39E−05 | 6.43E−05 |
| V = Volume (m$^3$) | | 2.14E−14 | |
| ε = Ratio of Cu Area/GrArea | Af_Cu/Af_Gr | 1.0056 | |
| E = Young's Modulus (Pa) | | 1.00E+12 | |
| σ = Stress (Pa) | E*ε | 1.01E+12 | |
| Us (Strain Energy) (J) | ½Vσε | 1.08E−02 | |
| Ui (Internal Energy) (J) | ½VE | 1.07E−02 | |
| ΔU = Energy Difference (J) | Us − Ui | 1.21E−04 | |
| ΔU = Energy Difference/Af (Jm$^{-2}$) | ΔU/Af | 1.90E+00 | |

Our process is advantageous compared to other methods by eliminating the typical wet-etching step to remove the copper foil catalyst from the graphene, thereby preventing contamination of the transferred graphene with metal particulates or residual etchant solution. Additionally, with this method the copper can recycled and reused, amounting to a significant cost savings. Our technique yields uniform, continuous graphene surfaces on a wide array of polymer substrates, which may be used for both rigid (thick substrate) and flexible (thin substrate) applications.

We claim:
1. A method for transferring graphene-on-metal foil onto a substrate, the method comprising:
   (i) coating the graphene side of graphene-on-metal foil with a binding solution to form a binding solution-on-graphene-on-metal foil, wherein the binding solution comprises a solute and a solvent;
   (ii) contacting a binding-solution side of the binding-solution-on-graphene-on-metal foil with the substrate to form a substrate-on-binding solution-on-graphene-on-metal foil;
   (iii) removing the metal foil from the substrate-on-binding solution-on-graphene-on-metal foil comprising:
      heating the substrate-on-binding solution-on-graphene-on-metal foil, and
      cooling the substrate-on-binding-solution-on-graphene-on-metal foil at a temperature from about −1° C. to about −10° C.;
   whereby the heating followed by the cooling allows the metal foil to be released from the substrate-on-binding solution-on-graphene-on-metal foil without peeling or etching.

2. The method of claim 1, wherein the coating comprises spin coating, drop casting, blade coating or dip coating.

3. The method of claim 1, wherein the method further comprises coating the substrate with a binding solution comprising a solute and a solvent, which may be the same or different from the binding solution coating the graphene-on-metal foil.

4. The method of claim 1, wherein the metal is selected from a group consisting of copper, nickel, platinum, and iridium.

5. The method of claim 1, wherein the solute in the binding solution is selected from the group consisting of polyamides, polyimides, polychloroethylenes, polyurethanes, polyvinylethers, polythioureas, polyacrylates, polycarbonates, polyesters, polyethylenes, polypropylenes, polysytrenes, PTFE, polyethylacetates, polyvinylacetates and fluoropolymers.

6. The method of claim 1, wherein the solute in the binding solution is selected from the group consisting of poly(methyl methacrylate), polyvinyl butyral, ethylene-vinyl acetate, thermoplastic polyurethane, polyethylene terephthalate, thermoset ethylene-vinyl acetate, polycarbonate, and polyethylene.

7. The method of claim 1, wherein the solvent in the binding solution is selected from the group consisting of water, chlorobenzene, acetone, methanol, N-methyl-2-pyrrolidone, tetrahydrofuran, dimethyl formamide, hexane, toluene, isopropyl alcohol, acetonitrile, chloroform, acetic acid, 2-methoxyethanol, and n-butylamine.

8. The method of claim 1, wherein the substrate is selected from the group consisting of polyamides, polyimides, polychloroethylenes, polyurethanes, polyvinylethers, polythioureas, polyacrylates, polycarbonates, polyesters, polyethylenes, polypropylenes, polystyrenes, nylons, polyethylacetates, polyvinylacetates and fluoropolymers.

9. The method of claim 1, wherein the substrate is selected from the group consisting of poly(methyl methacrylate), polycarbonate, polyethylene, polypropylene, polyester, nylon, and polyvinyl chloride.

10. The method of claim 1, wherein the binding solution in step (i) further comprises a dopant that increases the conductivity of the graphene.

11. The method of claim 3, wherein the binding solution coating the substrate further comprises a dopant that increases the conductivity of the graphene.

12. The method of claim 1, wherein the solute in the binding solution comprises between about 10 wt % and about 50 wt % poly(methyl methacrylate) and the solvent is selected from the group consisting of N-Methyl-2-pyrrolidone, tetrahydrofuran or dimethylformamide.

13. The method of claim 1, wherein the heating is performed at a temperature in the range of about 110° C. to about 160° C., and the temperature is held for a time ranging from about 5 minutes to about 4 hours.

14. The method of claim 1, wherein the temperature for cooling the substrate-on-binding solution-on-graphene-on-metal foil is held for a time ranging from about 5 minutes to about 4 hours.

15. The method of claim 1, wherein the metal foil is capable of being reused for subsequent graphene growth.

16. The method of claim 10, wherein the dopant is an alkali-metal salt.

17. The method of claim 16, wherein the alkali metal salt is selected from the group consisting of $MClO_4$ or MI, wherein M is selected from the group consisting of Li, Na and K.

18. The method of claim 17, wherein the concentration of M is in the range about 2% to about 45% by weight (w/w).

19. The method of claim 16, wherein the dopant is $NaClO_4$.

20. The method of claim 11, wherein the dopant is an alkali-metal salt.

21. The method of claim 20, wherein the alkali metal salt is selected from the group consisting of $MClO_4$ or MI, wherein M is selected from the group consisting of Li, Na and K.

22. The method of claim 21, wherein the concentration of M is in the range of about 2% to about 45% by weight (w/w).

23. The method of claim 20, wherein the dopant is $NaClO_4$.

24. A method for transferring graphene-on-metal foil onto a substrate, the method comprising:
(i) coating a graphene side of graphene-on-metal foil with a binding solution to form a binding solution-on-graphene-on-metal foil, wherein the binding solution comprises a solute and a solvent;
(ii) contacting a binding-solution side of the binding-solution-on-graphene-on-metal foil with the substrate to form a substrate-on-binding solution-on-graphene-on-metal foil;
(iii) removing the metal foil from the substrate-on-binding solution-on-graphene-on-metal foil comprising:
heating the substrate-on-binding solution-on-graphene-on-metal foil, and
cooling the substrate-on-binding solution-on-graphene-on-metal foil at a temperature from about −1° C. to about −10° C.

25. A method for transferring graphene-on-metal foil onto a substrate, the method comprising:
(i) coating the graphene side of graphene-on-metal foil with a binding solution to form a binding solution-on-graphene-on-metal foil, wherein the binding solution comprises a solute and a solvent;
(ii) contacting a binding-solution side of the binding-solution-on-graphene-on-metal foil with the substrate to form a substrate-on-binding solution-on-graphene-on-metal foil;
(iii) removing the metal foil from the substrate-on-binding solution-on-graphene-on-metal foil comprising:
heating the substrate-on-binding solution-on-graphene-on-metal foil, and
cooling the substrate-on-binding solution-on-graphene-on-metal foil in a freezer.

\* \* \* \* \*